United States Patent [19]
Hirakawa

[11] Patent Number: 6,011,694
[45] Date of Patent: Jan. 4, 2000

[54] BALL GRID ARRAY SEMICONDUCTOR PACKAGE WITH SOLDER BALL OPENINGS IN AN INSULATIVE BASE

[75] Inventor: Tadashi Hirakawa, Osaka, Japan

[73] Assignee: Fuji Machinery Mfg. & Electronics Co., Ltd., Osaka, Japan

[21] Appl. No.: 08/904,394

[22] Filed: Aug. 1, 1997

Related U.S. Application Data

[63] Continuation-in-part of application No. 08/805,175, Feb. 26, 1997, and application No. 08/811,810, Mar. 6, 1997.

[30] Foreign Application Priority Data

Aug. 1, 1996 [JP] Japan ..................................... 8-219226

[51] Int. Cl.[7] .............................. H05K 1/14; H05K 1/18; H05K 7/20; H01L 23/12
[52] U.S. Cl. ......................... 361/774; 174/16.3; 174/260; 257/707; 257/738; 257/778; 361/760; 361/704; 361/783
[58] Field of Search .................................. 174/16.3, 252, 174/255, 260, 26, 263, 264, 265, 266, 268; 228/180.21, 180.22; 257/692, 678, 697, 698, 700, 707, 712, 713, 717, 723, 724, 728, 737, 738, 772, 778, 780, 784, 786; 361/760, 761, 763, 764, 772, 774, 777, 779, 783, 807, 809, 813; 438/612, 613; 439/68, 83, 526

[56] References Cited

U.S. PATENT DOCUMENTS

| | | | |
|---|---|---|---|
| 4,791,075 | 12/1988 | Lin | 438/612 |
| 5,216,278 | 6/1993 | Lin et al. | 257/737 |
| 5,474,957 | 12/1995 | Urushima | 438/612 |
| 5,602,059 | 2/1997 | Horiuchi et al. | 438/612 |
| 5,650,662 | 7/1997 | Edwards et al. | 257/700 |
| 5,663,530 | 9/1997 | Schueller et al. | 174/260 |
| 5,679,978 | 10/1997 | Kawahara et al. | 257/700 |
| 5,710,695 | 1/1998 | Manteghi | 257/738 |
| 5,737,191 | 4/1998 | Horiuchi et al. | 257/697 |

FOREIGN PATENT DOCUMENTS

| | | | |
|---|---|---|---|
| 62-156847 | 7/1987 | Japan . | |
| 62-216250 | 9/1987 | Japan . | |
| 63-2430 | 3/1988 | Japan | 257/784 |
| 9-246684 | 9/1997 | Japan . | |
| 10-125857 | 5/1998 | Japan . | |

*Primary Examiner*—Donald Sparks
*Attorney, Agent, or Firm*—Skjerven, Morrill, MacPherson, Franklin & Friel LLP

[57] ABSTRACT

An area grid array package such as a ball grid array enables high pin count and high density with no problems of routing, and at low cost. Independent and non-connected circuits are formed on a first surface and a second surface of an insulative base material, each circuit on each surface having first chip connection pads formed on one end to connect to a semiconductor chip, the other end having second solder ball pads to mount solder balls. The chip is connected to the first connection pads by either bonding wires or connection bumps extending through holes in the base material and are molded by a resin. Each solder ball pad on each surface has a solder ball attached with the solder balls extending through openings in the base material. The insulative base material and the semiconductor chip may be attached to a heat slug.

19 Claims, 6 Drawing Sheets

BALL GRID ARRAY SEMICONDUCTOR PACKAGE WITH SOLDER BALL OPENINGS IN AN INSULATIVE BASE

This application is a continuation-in-part of U.S. applications Ser. No. 08/805,175 filed Feb. 26, 1997, now abandoned and U.S. Ser. No. 08/811,810 filed Mar. 6, 1997, now abandoned.

FIELD OF THE INVENTION

This invention is related to a ball grid array packages. More precisely, this invention is related to the structure of bonding pads for wire bonding or ball bonding of semiconductor chips on an insulative base material such as a flexible insulative tape.

BACKGROUND OF THE INVENTION

Conventionally, wire bonding by gold wire have been used to mount semiconductor chips on printed circuit boards. The gold wire is connected on both ends with electrodes located on the semiconductor chip and the printed circuit boards.

As the lead count of semiconductor chips increases, and the pad pitch on the chip decreases, the pad pitch on the printed circuit boards is decreasing. Hence, the pad density of the recent printed circuit boards is so high that it is almost impossible to manufacture with the ordinary printed circuit board technology. Multilayer boards and multiple bonding shelves have been developed to alleviate the pad density on the printed circuit boards.

These printed circuit boards have been made by technologies such as laminating boards having preformed larger and smaller openings and by fabricating a printed circuit board with bonding shelves (e.g. Japan Examined Patent 2-5014, Japanese Examined Patent 5-41039), or by laminating prefabricated cores to form multilayer boards, and etching the opening by a laser (applied by the inventor hereof, Japanese Application Patent 7-171391).

The conventional printed circuit boards having multiple bonding shelves mentioned above were complex in manufacturing technology, and also costly, and a less expensive process is desired. On the other hand, some problems were left in wire bonding, since the multiple bonding pads had level differences.

The present invention aims to solve the problems inherent in conventional printed circuit boards. The objective of this invention is to provide printed circuit boards for mounting semiconductor chips which can be fabricated in a simple manner with inexpensive cost while maintaining high density bonding pads, and also keeping the level difference to a minimum to make wire bonding easy.

Area grid array package technology has expanded in recent year as a technology to connect semiconductor chips and printed circuit boards. This technology at times called a ball grid array (BGA) or chip size package, aims to make connection with a printed circuit board, called a "mother board", by conforming grid pads, and putting solder balls or solder paste on these pads. This technology is described in the book "Ball Grid Array Technology" edited by John H. Lau and published by McGraw Hill in 1995.

Figure 7:
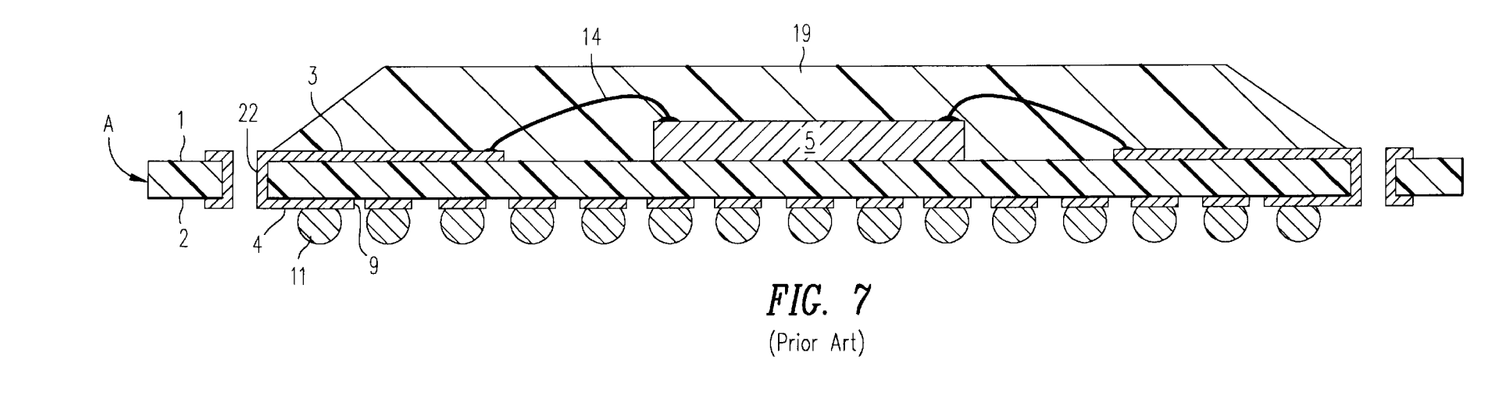
FIG. 7 is a cross-sectional view showing an example of a conventional area grid array package.

In the conventional area g rid array package, as shown in FIG. 7, circuits 3, 4 are formed on both sides of the insulative base material A, and the circuits 3,4 are connected with through-holes 22. On the back side of the base material A, pads 9 are arranged in a grid, and solder balls 11 are located thereon. On the surface of the base material A, a semiconductor chip 5 is mounted, which is connected with each circuit 3 by bonding wires 14. The semiconductor is encapsulated by a molding resin 19.

However, in the above conventional structure, the area grid array package had one side to attach the semiconductor chip and the other side to attach solder balls. Hence, all traces (metallization/conductive paths) usually had to be routed from the top to the back side. To attain this, through-holes have been needed on the external edges. Since these through-holes are usually mechanically formed, they are costly, and they have a smaller pitch in higher pin count packages and have higher density packages to attain a pre-designed size. Thus decrease of yield and electromigration were liable to occur.

To solve these problems, some technologies have been disclosed such as Japanese Opened Patent 7-74281 . In this patent, via-holes were used to connect the first surface and the second surface, and connection was made by plating the via-holes. This allows direct connection between the pad and the first surface, and the routing issues are very much alleviated. However, this technology also required formation of via-holes connecting the first surface and the second surface. This limited density of the circuits and caused high cost.

Figure 8:
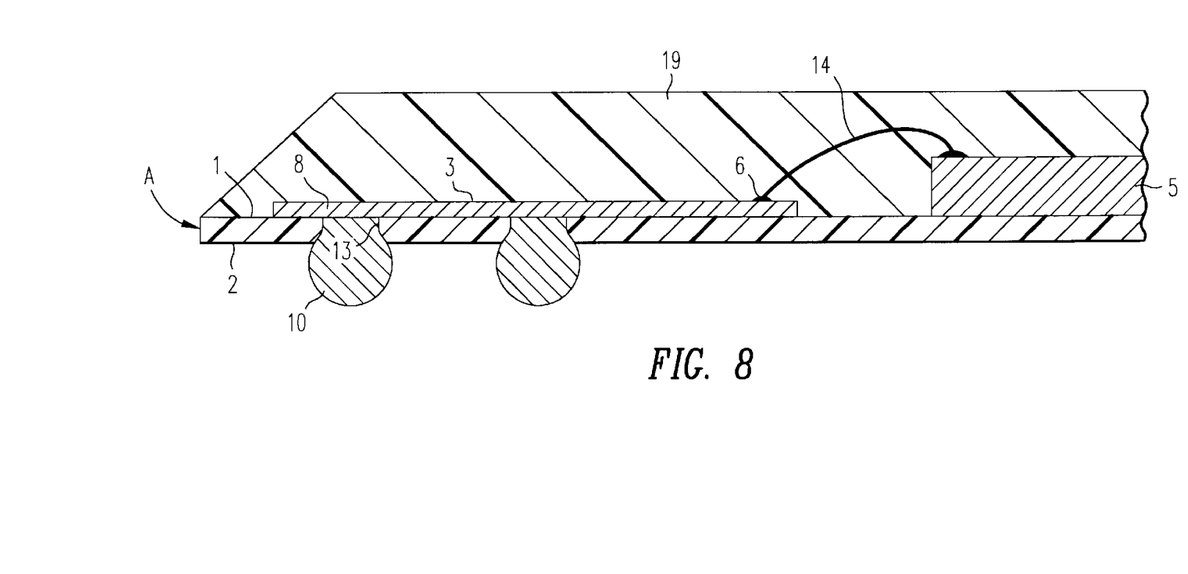
FIG. 8 is a cross-sectional view showing an area grid array package of my copending application.

Another proposal by the inventor hereof Japan Application Patent, H8-78261 and shown in U.S. application Ser. No. 08/811,810, now abandoned, is seen in FIG. 8, wherein a flexible tape A such as polyimide tape is used as a insulative base material, and circuits 3 (also called circuitry metallizations or traces) are formed on the first surface 1, a semiconductor chip 5 is mounted on the same surface, and connection pads 6 on the first surface 1 are connected to the semiconductor chip 5 by bonding wires 14. The package is molded using a molding resin 19 such as an epoxy resin, and solder balls 10 are attached to boarding pads 8 in an opening 13 formed from the second surface 2. This structure is advantageous in attaining higher density and lower cost, since the openings for the solder pads are made in the tape A itself, and there is no need for solder resist to prevent flowing of solder in reflow soldering. However, because the substrate is just single sided, there are some limitation in pin count, and it is sometimes difficult to obtain extremely high density.

Figure 9:
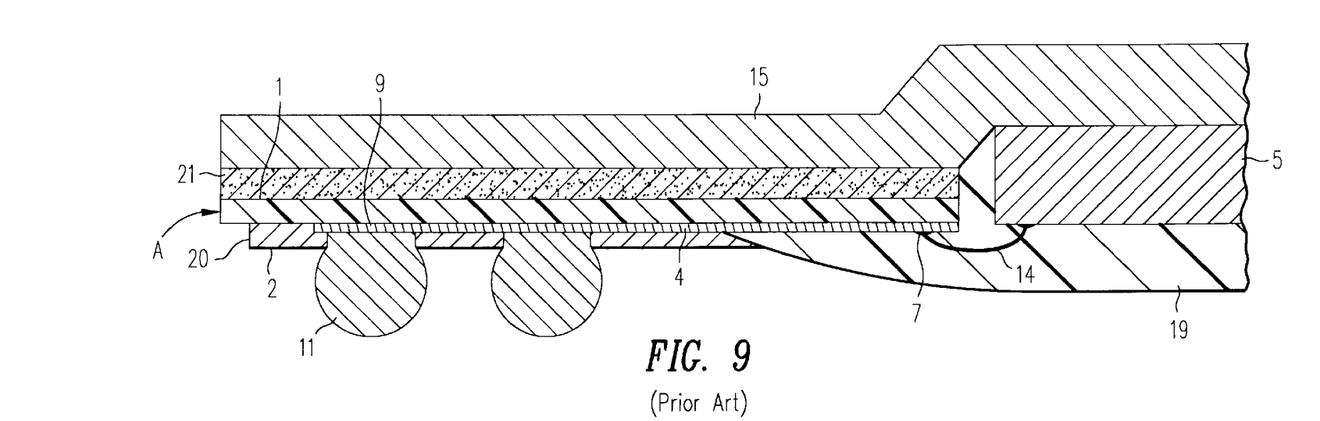
FIG. 9 is a cross-sectional view showing another example of a conventional area grid array package.

Other proposals (e.g. Japanese Open Patent 7-321250, U.S. Pat. No. 5,420,460) were made (FIG. 9), in which flexible synthetic tapes A such as polyimide are used instead of rigid laminates. In the second surface 2 circuits 4 are formed, and the substrate A is attached to the back side of heat slug 15 using an adhesive 21. A semiconductor chip 5 is mounted underneath the said heat slug 15 in a "Flip-chip configuration. Electrical connection is made between the semiconductor chip 5 and the pads 7 for connection with the semiconductor chip, encapsulated with a molding resin 19, and solder balls 11 are attached utilizing a solder resist mask 20 as seen in FIG. 9. This structure is useful, since routing on the tape can be only single-sided, and if patterning technology of TAB tapes are used, the tapes can have higher density than rigid laminates, and the above-mentioned difficulty in routing is very much alleviated. However, this structure has had a limitation as to pin count, and usually, 300–400 pins are a maximum.

A structure (FIG. 10) part of which is shown in U.S. application Ser. No. 08/811,810, now abandoned, includes circuits 3 formed on the first surface 1 of a flexible tape made of a synthetic resin such as polyimide as an insulative base material A, which is attached by an adhesive such as an epoxy, epoxy-acrylic or polyolefin adhesive to the back side of a heat slug 15 with the reverse side of the base material A having the circuit upward. A semiconductor chip 5 is attached underneath the heat slug 15 and connected electrically to the circuit traces with bonding wires 14. The chip and bond wires are encapsulated with a mold resin 19. Openings 13 are formed in base material A for attaching solder balls 10 from the second surface 2 of the tape A to solder ball pads. This structure has advantages because it does not need coating of photo-sensitive liquid solder resist to prevent flowing out of solder in reflow soldering, since the opening to the solder pad is made in the tape itself. Hence, it is easy to make higher density packages at a lower cost. However, since the structure had traces just on one side, the pin number was limited, and usually the maximum pin count was 300–400. Limitation of pin count was a problem.

Technologies of using a laser for the formation of printed circuit boards are used mainly to perforate via holes. The laser used here is either an excimer laser, a YAG laser, or an impact laser which is an improved carbon dioxide laser. The application of an excimer laser to the manufacturing printed circuit boards are described in Japanese Open Patent 5-136650, 5-152744, and 5-152748, and the application of impact laser to the manufacturing of printed circuit boards is described in "A Large Format Modified TEA CO2 Laser Based Process for Cost Effective Via Generation" (1994 International Conference on Multichip Modules, Apr. 13–15, 1994).

SUMMARY OF THE INVENTION

The printed circuit board for mounting semiconductor chips in this invention is a printed circuit board having conductive traces (also called circuits or circuitry metallizations) on both sides. The circuit traces are formed by copper or other electrically conductive foil on a first surface of the base material A. The traces include first bonding pads facing outwardly from a first side of the base material. A circuit is also formed by copper foil on the second opposite surface of the base material A including second bonding pads accessible through openings formed in the base material A. The first and second bonding pads are located adjacent to each other on opposite sides of the base material to form two rows of bonding pads as seen in FIGS. 3–4 of U.S. application Ser. No. 08/805,175, now abandoned.

A printed circuit board for mounting a semiconductor chip or chips includes a base material or substrate; a series of conductive traces formed of conductive foil, such as copper foil, on both sides of the base material; the traces on a top first surface of the base material having first bonding pads on an exposed side of the conductive foil; and the traces on a second surface of the base material having second bonding pads on the top side of conductive foil. The first and second bonding pads are located in rows adjacent to each other as shown in U.S. application Ser. No. 08/805,175, now abandoned, incorporated herein by reference. A series of openings are provided in the base material adjacent to the first bonding pads and leading to the second bonding pads. Bonding wires are connectable directly from connector pads of a chip to respective first connection pads and through the openings to respective second bonding pads. A resin encapsulant is normally then molded about the traces, the chip(s) and the bond wires forming a device package, with suitable leads extending from the package.

The present invention aims to provide no single-sided traces, or double-sided traces connected to each other by via-holes, but to provide a third structure of an area grid array package with an improvement over conventional BGA packages. An objective of this invention is to provide a high pin count and high density area grid array package which can mount high-pin-count semiconductor chips with no problems of routing, and in addition, to provide an area grid array package with low costs.

To solve the problems of the packages discussed above, the area grid array package of this invention include independent and non-connected circuits 3, 4 formed on the first surface 1 and the second surface 2 of an insulative base material A, each circuit 3, 4 on each surface 1,2 having connection pads 6, 7 formed on one end to connect to semiconductor chip 5, the other ends having second bonding or solder ball pads 8, 9 to mount solder balls.

The circuits are used to electrically connect the mounted semiconductor chip 5 and the connection pads 6, 7 on each surface 1, 2. The chip 5, bond wires 14 and connection pads 6, 7 are molded by a resin encapsulant. Each surface 1, 2 includes solder ball pads 8, 9 having solder balls 10 attached thereto.

To solve the problems of the prior art packages discussed above, in a second embodiment of the area grid array package of this invention independent and non-connected circuits 3, 4 are formed on the first surface 1 and the second surface 2 of an insulative base material. Each circuit 3, 4 on each surface 1, 2 includes connection pads 6, 7 formed on one end to connect to semiconductor chip, and pads 8, 9 to mount solder balls on the other end. The base material A and the semiconductor chip 5 are attached to a heat slug 15. The semiconductor chip 5 and the connection pads 6, 7 are electrically connected and molded by an encapsulant 19 and solder balls 10, 11 are attached to each pad 8, 9.

For clarity of explanation, parts of the BGA package of prior art devices (FIGS. 7 and 9), those of Applicant's previously identified applications and those in this specification have been numbered with numbers common to all.

DETAILED DESCRIPTION

Figure 1:
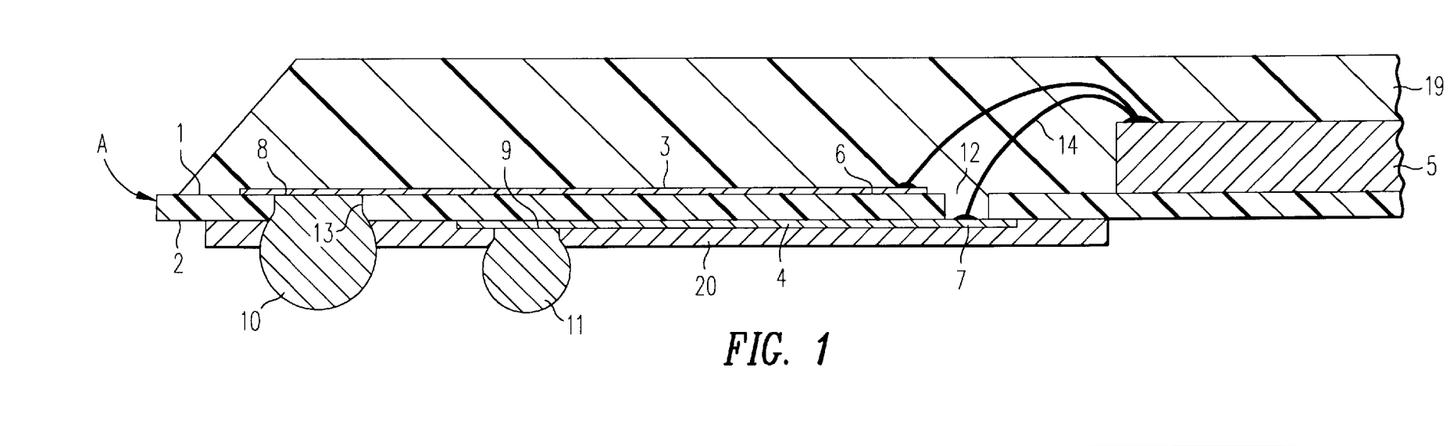
FIG. 1 is a cross-sectional view of a part of the area grid array package of this invention.
Figure 2:
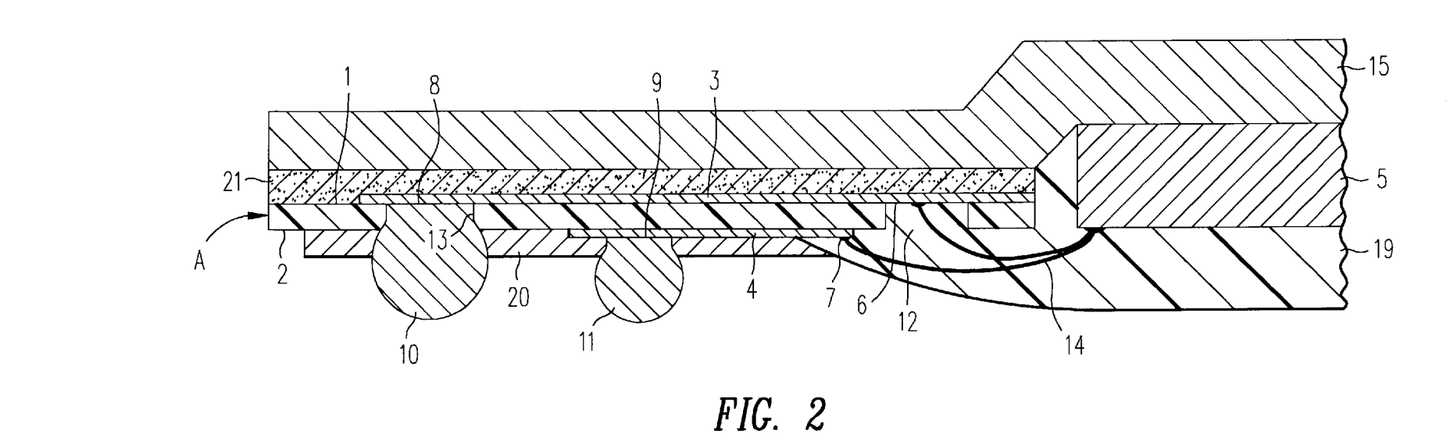
FIG. 2 is a cross-sectional view of part of a second embodiment of the area grid array package of this invention.
Figure 6:
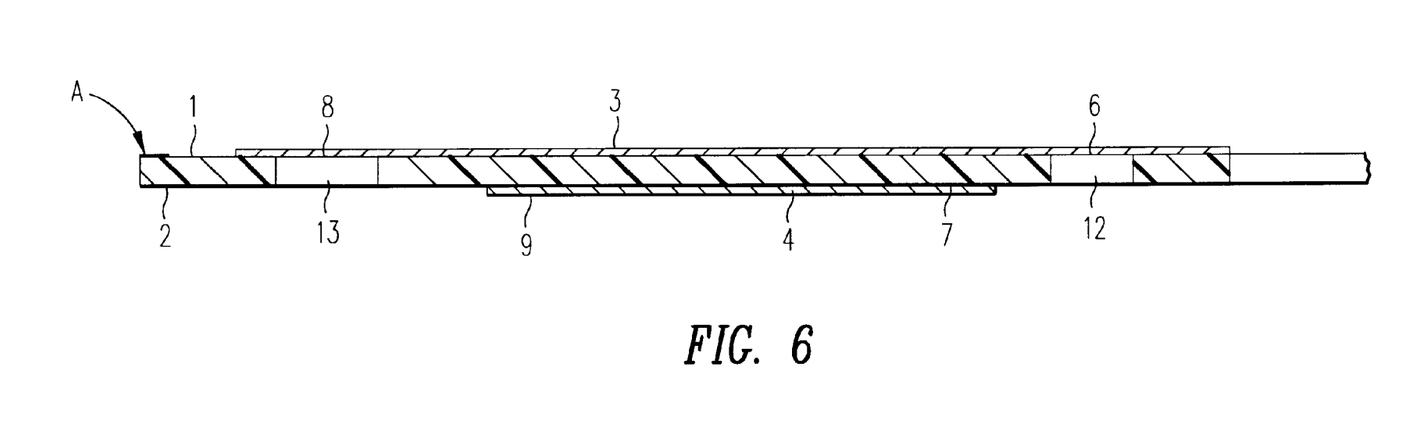
FIG. 6 is a cross-sectional view of an insulative substrate used in the embodiment shown in FIG. 2.

In the construction area grid array packages of this invention, pads 8 on a first surface 1 of a base material A for solder ball attachment have normally circular openings 13 from the second surface 2 of the base material A (FIGS. 1–6, 8, 10 and 11). On the other hand, the connecting pads 7 for connecting to semiconductor chip(s) have two embodiments. One is on the second surface 2 of the base material A, and they have normally circular openings 12 from the first surface 1 on the base material (FIGS. 1, 3, 5) The other is on the first surface 1 of the base material A, and they have normally circular openings from the second surface 2 of the base material A (FIGS. 2, 6).

The semiconductor chip 5 is connected to the pads 6, 7 on the insulative base material A by bonding wires 14 (FIGS. 1, 2, 3), as well as in a flip chip configuration using solder bumps or balls (including bumps and pedestals) 16, 17 (FIG. 4), or by gang bonding using tape automated bonding (not shown).

Figure 3:
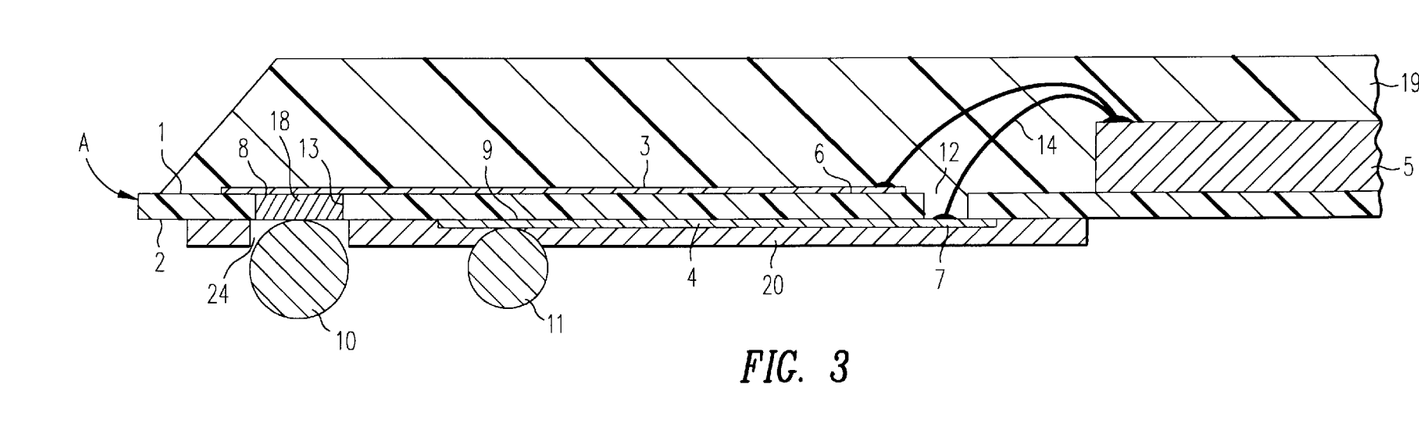
FIG. 3 is a cross-sectional view of part of a third embodiment of the area grid array package of this invention.
Figure 4:
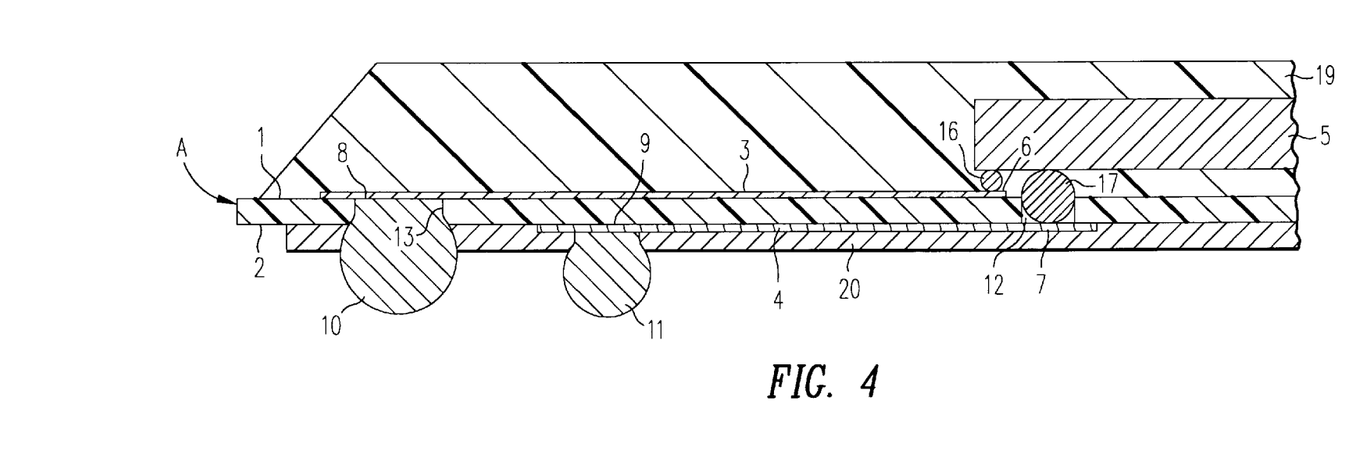
FIG. 4 is a cross-sectional view of part of a fourth embodiment of the area grid array package of this invention.
Figure 5:
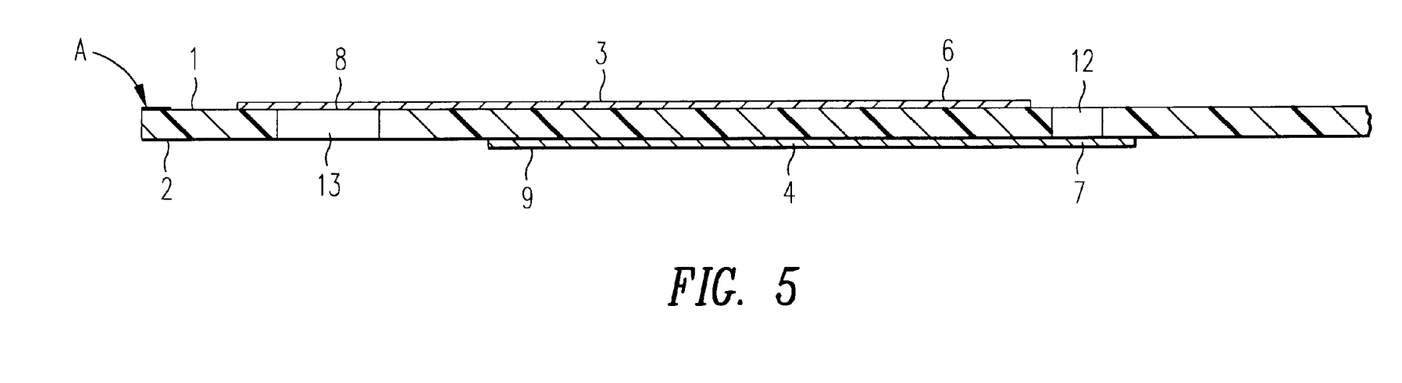
FIG. 5 is a cross-sectional view of an insulative substrate used in the embodiments shown in FIGS. 1, 3, 4.

The solder balls 10, 11, attached to the pads 8, 9 on the first surface 1 and the second surface 2 of the base material A are attached in a solder melt fixed connection to a facing side of pads 8, 9 at different levels of the pads 8, 9. The levels are different by the thickness of the base material A. To compensate for the differing levels, it is preferable that the diameter of the solder ball 10 to be attached to the first surface 1 of the base material A is larger than the diameter of solder ball 11 in the amount representing the thickness of the base material A (FIGS. 1, 2 and 4). Also when semiconductor chip 5 is mounted in a flip chip configuration, it is preferable that the diameter of the bump 17 to be attached to the second surface 2 of the base material A is larger than that of the bump 16 to be attached to the first surface 1 of the base material A by the thickness of the base material A (FIG. 4). The compensation of the level difference can also be attained by keeping the diameter of solder balls 10, 11 the same, and filling the opening 13 of the pads 8 on the first surface 1 of the base material A for attaching solder balls with conductive filler 18 of conductive resins or plated layers which corresponds to the thickness of the base material A (FIG. 3). This is also true for the case of flip chips as well as for the case of wire bonding.

To describe the insulative base material A more precisely, it may be a three layer structure having the first and the second conductive layer on both sides of the insulative layer. The typical thickness of the insulative layer is 20–100 micron. Adhesive layers can be included in-between the insulative layer and the conductive layer. The resin component of the insulative layer may include epoxy resins, polyimide resins, bismaleimide triazine resins, or polysilane resins and are preferably used. Both thermosetting and thermoplastic resins can be used. Among thermosetting resins, epoxy resins, polyimide resins polycyanurate resins, polysilane resins, and polybenzimidazole resins are preferable used. The base material can include reinforcement, and the reinforcement can be an inorganic fiber such as a glass fiber, or be an organic fiber such as aramid fibers, Teflon fibers, polyether-ether-ketone fibers, or polybenzimidazole fibers. Among the organic fibers, aramid fibers and Teflon fibers are preferable because they are easily processed by a laser and have excellent electrical properties. Among aramid fibers, co-polyparaphenylene 3, 4' oxydiphenyletheleph-thalamide fiber is more preferable because of lower ion impurities and lower moisture regain. The insulative layer can be a film or a sheet not including reinforcement. In this case, the material can be polyester resins, polyether-ether ketone resins, polyamide resins, especially aramid resins, more especially polyparaphernyleneterephthalamide resins.

On the insulative base material A, conductive layers on the both sides of the insulative layer are processed to form circuits, and in the circuits 3 of the first surface 1 and the circuits 4 on the second layer 2, a spare area (including openings or paddles) for mounting the semiconductor chip 5 is located. On the end of inner circuit 3, 4, from which the circuits extend to the external edges, connection pads 6, 7 are provided for electrical connection with the semiconductor chip contact input/output pads. On the other end of the external circuit 3, 4, solder ball pads 8, 9 are located for attachment of solder balls 10, 11. As mentioned above, each circuit 3, 4 has connection pads 6, 7 for connecting to a semiconductor chip on one end, and pads for attaching solder balls on the other end, but each circuit 3, 4 is not connected to another and is independent.

Figure 10:
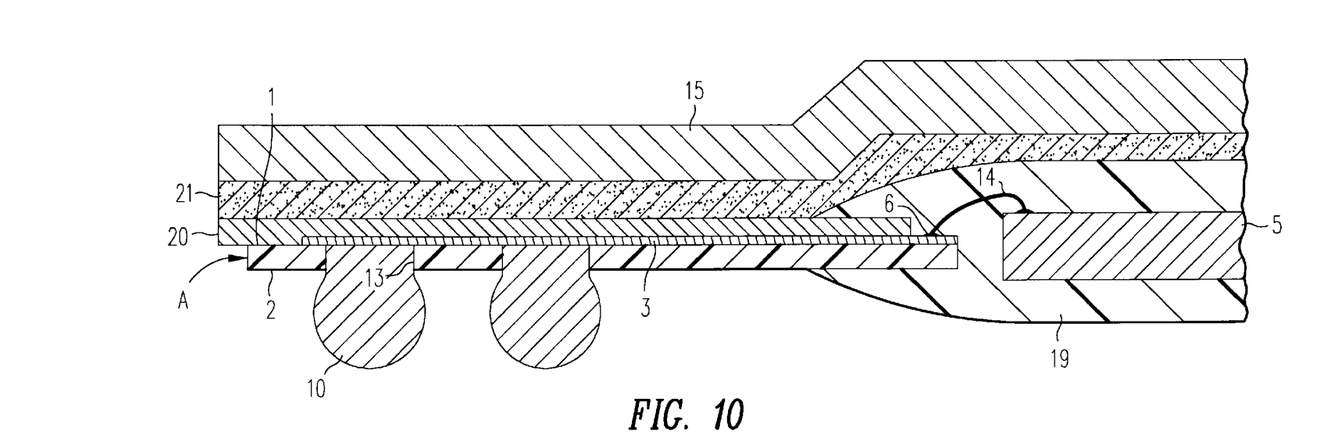
FIG. 10 is a cross-sectional view showing an area grid array package of my copending application with the addition of a heat slug.

The method for forming the circuits 3, 4 on the surfaces 1, 2 of insulative material A is usually the substractive method, and circuit formation is made by laser or chemical etching or by punching. By this means, as mentioned above, the center of the base material is kept open for mounting a semiconductor chip, and the circuit 3, 4 extends from the periphery of the chip to an external area where the bonding pads 8, 9 for attaching solder balls are formed. Openings 12 are formed for pads 6, 7 formed on the base material A for connecting to semiconductor chips. To form the openings 12, 13, laser processing is preferable because of high precision and lower cost. The laser can be a carbon dioxide laser, YAG laser or excimer laser. An impact laser, which is a type of carbon dioxide laser, a YAG laser, or excimer laser are preferably used to make the inner walls smooth, and with no rough surfaces. In the Figures, 14 is a bonding wire, 19 is a molding resin, 20 is a photosensitive liquid solder resist, and 21 is an adhesive. The photosensitive liquid solder resist 20 is coated on the second surface 2 only, but naturally, the first surface also can be coated by such solder resist. As seen in FIG. 10, a second electrically insulative adhesive 23 may be utilized between the adhesive 21 and surface 1 of insulative tape material A. Adhesive 21 may be thermally conductive to insure optimum heat transfer from the metallizations and the semiconductor chip.

The area grid array package of this invention, as mentioned above, has traces 3, 4 on both sides of the first surface 1 and the second surface 2, and the circuit 3 and 4 can be connected to the semiconductor chip 5 independently, and can be connected to mother boards independently. For this reason, the package of this invention can easily attain high pin count and high density, and is devoid of through-holes and via-holes with connect circuits 3, 4 on the both sides, while making circuits to both sides. The substrates for the area grid array package of this invention can be a rigid board or a panel, or especially as a tape from flexible synthetic films. The latter is preferable, since the formation of circuits and opening, plating, and semiconductor mounting can be made continuously, and the total cost will be decreased.

The base material A or substrate used here may be a rigid laminate including reinforcements furnished as panels or a flexible synthetic resin film or sheet not including reinforcements or a tape which is preferred for high production.

On the first and the second surfaces 1, 2, copper foil circuits 3, 4 with a thickness of 5–20 microns are formed. Lamination of copper foil can be made either by laminating prepregs, using adhesives, hot pressing by use of a thermoplastic behavior of base material A, coating resins on the back of copper foils and dry-curing, and other methods.

Patterning for forming each circuit 3, 4, and bonding pads 6, 7, 8 and 9 can be made by the ordinary subtractive method. The additive method shown in the art can also be applied as long as the final structure meets the objective of this invention.

In case the base material A is opened by mechanical punching, the base material with adhesive attached is opened prior to lamination of the copper foil to both sides of the base material, i.e. on the first surface 1 and the second surface 2, and after that pattern-etching the traces and bonding pads. In an alternative, the copper foils can be attached to the base material prior to punching.

In any case, the laser beam is focused in a certain area, and applied from the top of the base material A. To limit the application area, a mask image method, a contact mask method, or a conformal mask method can be used. For application, forming patterns by applying a large area at once, or moving a small focused beam along the predetermined patterns, or scanning a small focused beam can be used.

EXAMPLE 1

The following is an example of the area grid array package of this invention.

As an insulative base material, a polyimide film with a thickness of 40 micron is used. On the first and the second surfaces, copper foils with a thickness of 18 micron are laminated to form double-sided copper-clad laminate. The laminate is slit into a tape with a width of 48 mm, and sprockets are formed on both sides just as in the process of making TAB tapes (not shown).

On the insulative base material A, patterning for circuits 3, 4, pads 6, 7 for connecting semiconductor chip 5, and pads 8, 9 for attaching solder balls are formed. Openings 12 for pads for connecting semiconductor chips and openings 13 for pads 8, 9 for attaching solder balls are made and desired plating of pads 6, 7, 8, 9 of circuits 3, 4 and a paddle (spare part) for attaching the semiconductor chip are processed. These processes can be reel-to-reel by moving tape continuously by sprocket holes in the base material A. Patterning of the copper foils on both sides of the insulative material is made by etching, i.e. with a subtractive method. The patterning area is typically kept around 35 mm×35 mm. In the center part of the area, a paddle is formed for mounting the semiconductor chip 5. A number of circuits 3, 4 are formed from the paddle to the external peripheral edges of the area. On the inner edges of each circuit 3, 4 of the first surface 1 and the second surface 2, pads 6, 7 are formed for connecting to semiconductor chip 5. The other ends of the circuits 3, 4 extend to the external edges, where pads 8, 9 for attaching solder balls are formed.

Among the said pads 6, 7 for connecting to semiconductor chip, the ones on the second surface 2 are made larger than those on the first surface, and openings 12 are formed by laser processing on the insulative layer from the first surface 1. In this example, the width of the pads 6 on the first surface for connecting to the semiconductor chip is 80 micron, and the pitch of the pads is 130 micron, and the width of the pads 7 on the second surface for connecting to semiconductor chip is 100 micron, and its pitch is 130 micron. The width of the opening 12 from the first surface is 80 micron. Pads 8, 9 are provided for attaching the solder balls. Openings 13 are formed by laser-processing the insulative layer of the base material A from the second surface. The attachment of solder balls 10 on the pads 8 for attaching solder pads is made through these openings 13 as will be mentioned later. The diameter of the pads 8, 9 for attaching solder balls is 0.5 mm, and its pitch is 1.27 mm. For the laser processing, several kinds of laser can be used, but here, an excimer laser was used by focusing the laser beam by a mask. A UV excimer laser beam with a wavelength of 254 mm may be used.

To adjust the levels of pads 8 on the first surface for attaching solder balls and the pads 9 on the second surface for attaching solder balls, the solder balls 10 on the pads on the first surface is kept larger than that of the solder balls 11 on the second surface. The difference of the diameter is dictated by the thickness of the base material, which is 40 micron here. On the center of the substrate A thus obtained, a semiconductor chip 5 is mounted, and connected to each of pads 6, 7 by wire bonding. Connection with the pads 7 on the second surface for connecting semiconductor chip is made through the opening 12 from the first surface 1.

Figure 11:
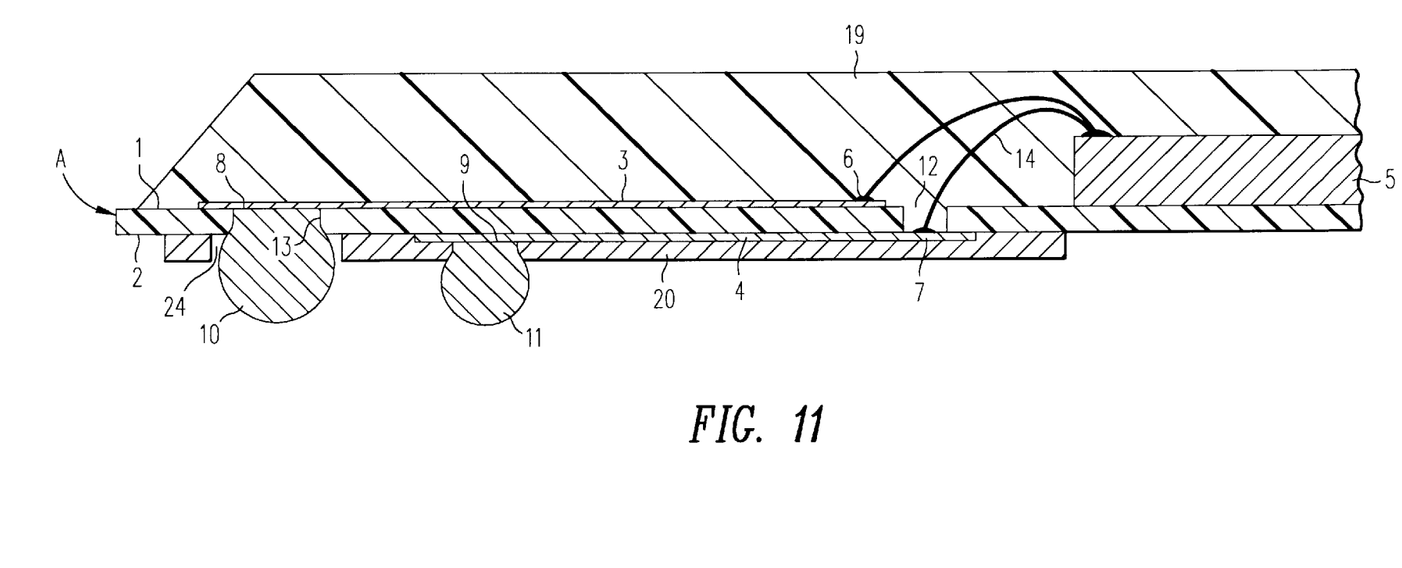
FIG. 11 is a cross-sectional view showing a fifth embodiment of the invention.

Then, the semiconductor chip 5 in the center and the first surface 1 side of the substrate A is encapsulated by overmolding thoroughly using a molding resin. From the second surface 2 side, solder balls 10 are attached to the pads 8 on the first surface 1 and solder balls are attached to the pads 9 on the second surface 2. As seen in FIGS. 1–4, a solder resist layer 20 can be employed to align solder balls 11 to pads 9. However, since it is desired to form solder balls 10 into openings 13 in the insulative tape material A, oversized holes 24 may be formed in the solder resist layer 20 to allow access of the solder balls into openings 13 without interference (as seen in FIG. 11) or to allow access of the solder ball to the conductive filler 18 (FIG. 3). As mentioned above, the diameter of the solder balls 10 to be attached to the pads 8 of the first surface 1 for attaching solder balls was kept larger by 40 micron than that of the solder balls 11 on the second surface 2 for attaching solder balls. Thus the lower end of all solder balls are adjusted to the same level. Thus, a high pin count and high density area grid array package was manufactured, in which each circuit 3, 4 on the first surface 1 and the second surface 2 of the base material A are kept independent, and a pin count as high as 540 leads including the first and the second surfaces was obtained.

The above explanation is mainly for the area grid array package as shown in FIG. 1, but the adjustment method of the levels for solder balls 10, 11 on the first and the second surfaces of the base material A is not limited to the abovementioned method. As shown in FIG. 3, the levels of solder balls 10, 11 can be adjusted by keeping the diameter of the solder balls the same, and filling the opening 13 for pads 8 for attaching solder balls with conductive filler 18 such as a conductive resin or a solder bump formed by plating corresponding to the thickness of the insulative layer.

Mounting of semiconductor chips is not limited to the direct mounting as shown in the above example. As shown in FIG. 2, substrate A with circuits 3, 4, pads 6, 7 chips and pads 8, 9 may as a sub-assembly be attached to a heat slug 21 by an adhesive 21, with the semiconductor chip mounted to the said heat slug 15. The chip is then connected to the pads 6, 7 by wire bonding etc., and solder balls 10, 11 attached to solder pads 8, 9.

Means of electrical connection between the pads 6, 7 on surface 1 and 2 for connecting to the semiconductor chip is not limited to wire bonding, but can be flip chip bonding by bumps 16, 17 as shown in FIG. 4. In this case also, the bumps 17 are connected to the pads 7 on the second surface 2 through opening 12 formed from the first surface. The level difference between the bumps 16 on the first surface, the bumps 17 on the pads 7 on the second surface 2 is compensated for the thickness of the insulative layer by having the diameter of bump 17 larger than bump 16 by that thickness. Although not shown here, the electrical connection between the pads 6, 7 and the semiconductor chip 5 is not limited to the technology mentioned above, but can be a gang bonding used in tape automated bonding.

As mentioned above, the area grid array package of this invention has the following advantages.

1) The area grid array package of this invention can form independent circuits on the first and the second surfaces respectively by simple means, and electrically connect each circuit to a semiconductor chip independently, and also to mother boards independently. For this reason, quite different from the area grid array package forming the circuit just on one side, the new package can attain high pin count and high density twice as high as conventional ones, and quite different from the conventional double-side boards, there is no need for through-holes or via holes which connect them, and routing is much easier, and yield is higher.

2) The area grid array package of this invention can use not only rigid panels as its insulative base material, but also flexible films. By using flexible tapes, a continuous processing of thorough processes including formation of circuits and openings, mounting of semiconductor chips, and thus cost reduction of manufacturing area grid array packages can be attained.

The above description of embodiments of this invention is intended to be illustrative and not limiting. Other embodiments of this invention will be obvious to those skilled in the art in view of the above disclosure.

I claim:

1. An area grid array package including independent and non-connected circuits formed on a first surface and a second surface of an insulative base material; respectively, each circuit on each surface having first pads formed on one end for connection to a semiconductor chip, another end of each circuit having solder ball pads to mount solder balls, each circuit being in electrical connection to a mounted semiconductor chip and the first pads, said circuits and said first pads being molded by an encapsulating resin, each solder ball pad on each surface having a solder ball attached thereto; and wherein conductive bumps connect the semiconductor chip to the first pads and the solder balls are connected to the solder ball pads, and wherein the diameter of the bumps to be attached to the first pads on the second surface of the insulative base is larger than that of the bumps to be attached to the first pads on the first surface of the insulative base, in order to compensate for the thickness of the insulative base material.

2. An area grid array package including independent and non-connected circuits formed on a first surface and a second surface of an insulative base material; respectively, each circuit on each surface having first pads formed on one end for connection to a semiconductor chip, another end of each circuit having solder ball pads to mount solder balls, each circuit being in electrical connection to a mounted semiconductor chip and the first pads, said circuits and said first pads being molded by an encapsulating resin, each solder ball pad on each surface having a solder ball attached thereto;

wherein first openings for attaching the solder balls are formed in said insulative base material extending from the second surface and, in which the first openings are filled by a conductive filler to compensate for the thickness of the insulative base material; and in which the conductive filler is a conductive resin or a plating layer.

3. An area grid array package including independent and non-connected circuits formed on a first surface and a second surface opposite to the first surface of an insulative base material, respectively, each circuit on each surface having first pads formed on one end for connection to a semiconductor chip, another end of each circuit having solder balls pads to mount solder balls, each circuit being in electrical connection to a mounted semiconductor chip and the first pads, said circuits and said first pads being molded by an encapsulating resin, each solder ball pad on each surface having a solder ball attached thereto;

wherein first openings for attaching the solder balls are formed in said insulative base material extending from the second surface such that each opening reaches to one of the solder ball pads, and wherein second openings are formed in the insulative base material for connecting the semiconductor chip to the first pads on the second surface of the insulative base material; and in which the diameter of the solder balls attached to the pads on the first surface of the insulative base material is larger than that of the solder balls to be attached to the pads on the second surface of the insulative base material to compensate for the thickness of the base material.

4. The area grid array package of claim 1 wherein the insulative base material and the semiconductor chip are attached to a heat slug.

5. The area grid array package of claim 1 in which the second openings for connecting to the semiconductor chip are formed from the first surface so that the openings reach to the first pads on the second surface.

6. The area grid array package of claim 1 in which the first and second openings are laser-formed openings.

7. The area gird array package of claim 1 in which the insulative base material is a rigid panel.

8. The area grid array package of claim 1 in which the insulative base material is a flexible film or a tape.

9. The area grid array package of claim 1 in which the openings leading to the solder ball pads are filled by a conductive filler to compensate for the thickness of the insulative base material.

10. The area grid array package of claim 1 in which the openings leading to the first pads are filled by a conductive filler to compensate for the thickness of the base material.

11. The area grid array package of claim 10 in which the conductive filler is a conductive resin.

12. A ball grid array semiconductor package comprising:

an insulative base material;

circuitry metallizations formed on a first surface and a second surface of the insulative base material the second surface being opposite to the first surface, each circuitry metallization having a first connection pad adjacent one end and a second bonding pad adjacent a second end;

a semiconductor chip mounted adjacent to said first surface and said first connection pads, said chip being electrically connected to said first connection pads of the circuitry metallizations;

wherein the insulative base material has first openings extending from the second surface of the insulative base material at a location under second bonding pads;

wherein each of said first openings confines a portion of a solder ball which is in a solder melt-fixed connection to a facing side of each said second bonding pads, wherein said first openings are in the second surface of the insulative base material and said second openings are either the first or the second surfaces of the insulative base material; and wherein said second openings are in the first surface and wherein solder balls extend from said chip to connection pads on the first surface and through said second openings to connection pads on said second surface.

13. The ball grid array semiconductor package as defined in claim 12 wherein the insulative base material is a film or a sheet.

14. The ball grid array semiconductor package as defined in claim 12 wherein the insulative base material is a reinforced laminate.

15. The ball grid array package as defined in claim 12 wherein said insulative base material and said chip are adhesively mounted to a heat slug.

16. The ball grid array package as defined in claim 12 wherein a conductive filler is included within said first openings.

17. An area grid array package including independent and non-connected circuits formed on a first surface and a second surface of an insulative base material; respectively, each circuit on each surface having first pads formed on one end for connection to a semiconductor chip, another end of each circuit having solder ball pads to mount solder balls, each circuit being in electrical connection to a mounted semiconductor chip and the first pads, said circuits and said first pads being molded by an encapsulating resin, each solder ball pad on each surface having a solder ball attached thereto;

wherein the diameter of the solder balls attached to the pads on the first surface of the insulative base material is larger than the diameter of the solder balls to be attached to the pads on the second surface of the insulative base material to compensate for the thickness of the base material; and wherein a correspondingly large diameter opening is provided in the insulative base material to confine the larger diameter solder balls.

18. An area grid array package including independent and non-connected circuits formed on a first surface and a second surface opposite to the first surface of an insulative base material, respectively, each circuit on each surface having first pads formed on one end for connection to a semiconductor chip, another end of each circuit having solder balls pads to mount solder balls, each circuit being in electrical connection to a mounted semiconductor chip and the first pads, said circuits and said first pads being molded by an encapsulating resin, each solder ball pad on each surface having a solder ball attached thereto;

wherein first openings for attaching the solder balls are formed in said insulative base material extending from the second surface such that each opening reaches to one of the solder ball pads, and wherein second openings are formed in the insulative base material for connecting the semiconductor chip to the first pads on the second surface of the insulative base material; and in which the opening leading to the first pads is filled with a conductive filler to compensate for the thickness of the base material and the conductive filler is a conductive resin.

19. The area grid array package of claim 18 wherein conductive bumps connect the semiconductor chip to the first pads and the solder balls are connected to the solder ball pads, and wherein the diameter of the bumps to be attached to the first pads on the second surface of the insulative base is larger than that of the bumps to be attached to the first pads on the first surface of the insulative base, in order to compensate for the thickness of the insulative base material.

* * * * *